United States Patent [19]
Gandy et al.

[11] Patent Number: 6,022,788
[45] Date of Patent: Feb. 8, 2000

[54] METHOD OF FORMING AN INTEGRATED CIRCUIT HAVING SPACER AFTER SHALLOW TRENCH FILL AND INTEGRATED CIRCUIT FORMED THEREBY

[75] Inventors: Todd Gandy, Phoenix; Ronald Sampson, Fountain Hills; Robert Hodges, Phoenix, all of Ariz.

[73] Assignee: STMicroelectronics, Inc., Carrollton, Tex.

[21] Appl. No.: 08/996,457

[22] Filed: Dec. 23, 1997

[51] Int. Cl.⁷ .................................................. H01L 21/306
[52] U.S. Cl. .......................... 438/424; 438/692; 438/724; 438/733; 438/763
[58] Field of Search .................................... 438/424, 435, 438/690, 691, 692, 700, 724, 733, 759, 763, 959, 427

[56] References Cited

U.S. PATENT DOCUMENTS

| | | | |
|---|---|---|---|
| 4,297,694 | 10/1981 | Matherat | 340/750 |
| 4,368,436 | 1/1983 | Palara et al. | 330/207 |
| 4,891,788 | 1/1990 | Kreifels | 365/49 |
| 4,962,064 | 10/1990 | Haskell et al. | 438/437 |
| 5,130,268 | 7/1992 | Liou et al. | 437/67 |
| 5,244,827 | 9/1993 | Dixit et al. | 437/70 |
| 5,247,481 | 9/1993 | Conan | 365/200 |
| 5,355,341 | 10/1994 | Gaultier et al. | 365/201 |
| 5,356,513 | 10/1994 | Burke et al. | 156/636 |
| 5,395,785 | 3/1995 | Nguyen et al. | 437/52 |
| 5,395,801 | 3/1995 | Doan et al. | 438/692 |
| 5,410,176 | 4/1995 | Liou et al. | 257/50 |
| 5,459,096 | 10/1995 | Venkatesan et al. | 438/437 |
| 5,540,811 | 7/1996 | Morita | 156/636.1 |
| 5,548,554 | 8/1996 | Pascucci et al. | 365/200 |
| 5,665,202 | 9/1997 | Subramanian et al. | 438/692 |
| 5,897,360 | 4/1999 | Kawaguchi | 438/431 |

*Primary Examiner*—Wael M. Fahmy
*Assistant Examiner*—Kurt Eaton
*Attorney, Agent, or Firm*—Theodore E. Galanthay; Lisa K. Jorgenson; Christopher F. Regan

[57] ABSTRACT

A method of forming an isolation region in an integrated circuit and an integrated circuit formed thereby. A method preferably includes forming at least one trench in a semiconductor substrate, forming an insulation layer of material in the at least one trench and on peripheral regions of the at least one trench of the semiconductor substrate, forming a sacrificial layer of material on the insulation layer having a different polishing rate than the insulation layer, and polishing the layer having the different polishing rate and portions of the insulation layer so that the sacrificial layer having the different polishing rate and portions of the insulation layer are removed, so that other portions of the insulation layer remain in the at least one trench of the substrate, and so that the upper surface of the at least one trench and the peripheral regions thereof in combination provide a substantially planar surface.

33 Claims, 1 Drawing Sheet

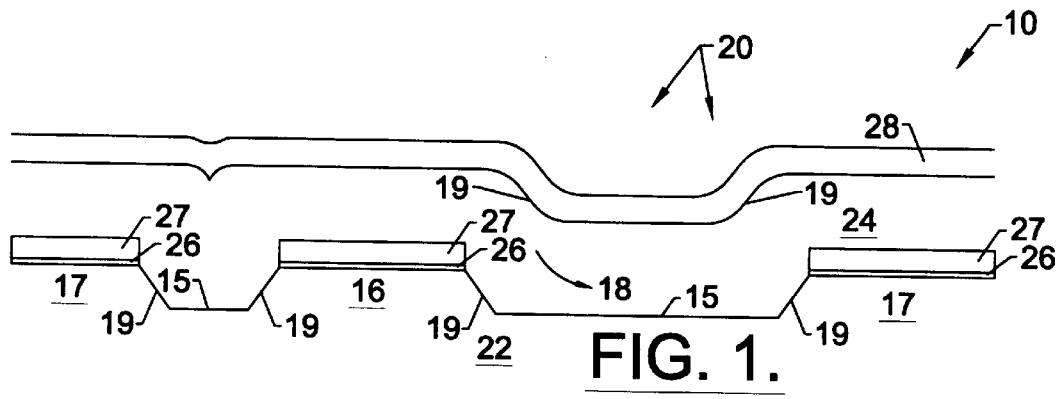
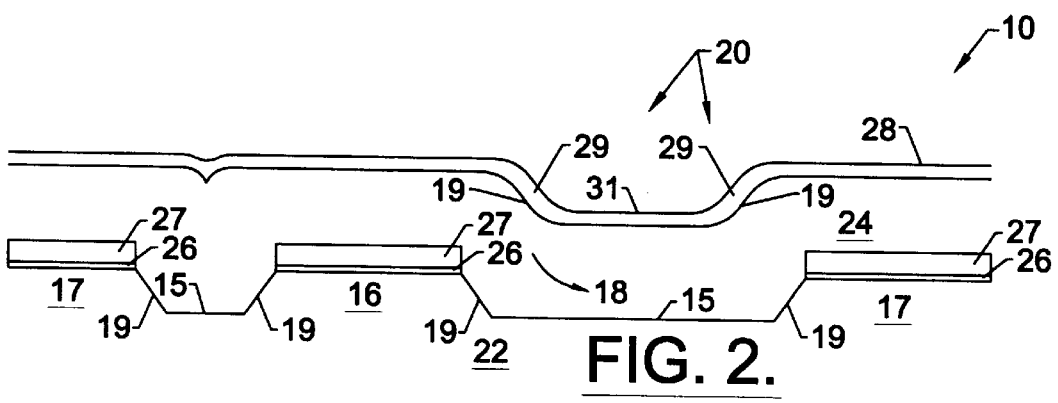
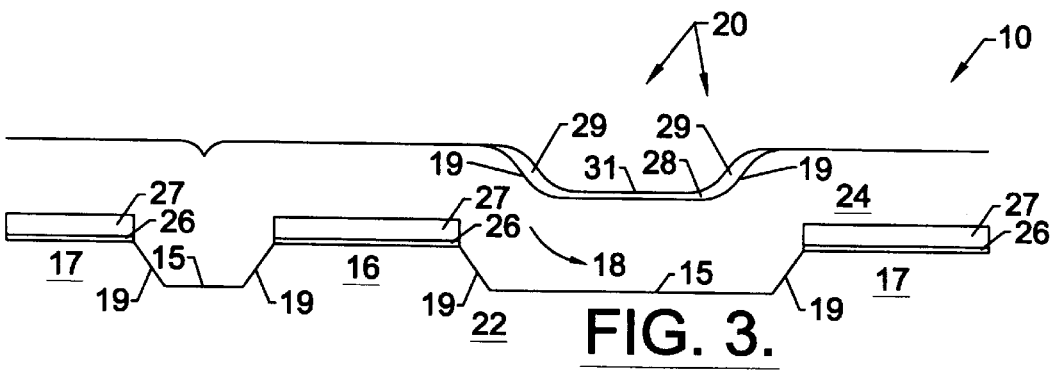
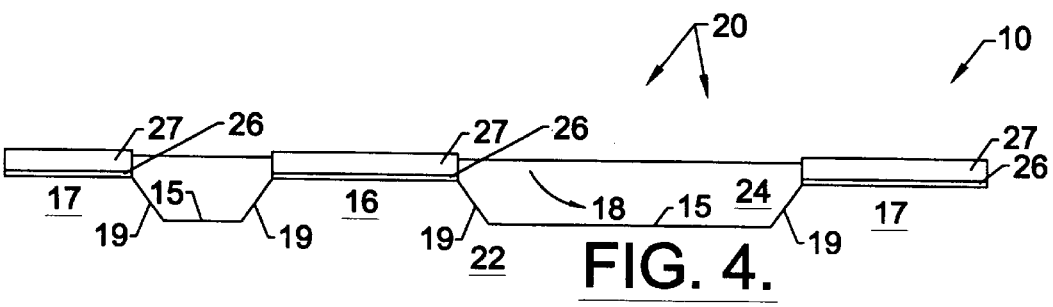

METHOD OF FORMING AN INTEGRATED CIRCUIT HAVING SPACER AFTER SHALLOW TRENCH FILL AND INTEGRATED CIRCUIT FORMED THEREBY

FIELD OF THE INVENTION

The invention relates to the field of integrated circuits, and, more particularly, to the field of integrated circuit fabrication.

BACKGROUND OF THE INVENTION

Over the years, in the field of integrated circuits, it has been recognized that the manufacturing cost of a given integrated circuit is largely dependent upon the chip area required for implementation of a desired function. Accordingly, the geometries and sizes of active components, such as the gate electrode in metal-oxide-semiconductor ("MOS") technology, are important elements in defining the chip area for a given integrated circuit. These geometries and sizes, in turn, are often dependent upon the photolithographic resolution available for a particular manufacturing facility.

As the degree of integration has advanced over the years, however, it has been recognized that it is desired to minimize the topographical excursion of the surface at each level, especially the upper levels. To accomplish this, various planarization techniques have been developed to planarize the interlevel dielectric. Some of these, for example, include chemical-mechanical-polishing ("CMP"), use of permanent spin-on-glass ("SOG"), e.g., left in place in the final chip, and sacrificial etchback SOG.

SOG deposition has been used in the semiconductor industry for many years. The unprocessed SOG material is a fluid or gel-like material. After the fluid material is coated onto the face of a wafer, the wafer is rotated at high speed to throw off or discard the excess material. The surface tension and adhesion of the material provides a generally flat or substantially planarized surface with a controlled thickness. The fluid material is then baked in order to drive off solvents and provide a stable solid silicate glass.

An example of pre-metal planarization can be seen in U.S. Pat. No. 5,395,785 by Nguyen et al. titled *SRAM Cell Fabrication With Interlevel Dielectric Planarization.* This patent described a method wherein planarization of a static random access memory ("SRAM") cell is performed before metal formation and before resistor formation. The pre-metal planarization utilizes a sandwich structure having permanent SOG, undoped glass, and permanent SOG. The undoped glass is used as a buffer layer between two layers of SOG to prevent SOG cracks. The double SOG enhances the degree of planarization.

Another factor in the chip area required for integrated circuits is the isolation technology. Sufficient electrical isolation must be provided between active circuit elements so that leakage therebetween does not cause functional or specification failure. The isolation is particularly important for circuits such as SRAMs where maintenance of stored data by extremely low levels of standby current has become highly desirable. Because the presence of leakage between active regions in the memory will greatly increase the standby current drawn, such low standby currents require excellent isolation. This increasingly difficult standby current requirement or desirability, in combination with the demand for smaller and smaller memory cells in denser memory array, forms increased pressure on the isolation technology in SRAMS and other integrated circuits.

A known isolation technique, for example, is local oxidation of silicon ("LOCOS"). In LOCOS, an oxidation barrier is placed over the locations of the surface of the chip into which the active devices are to be formed, i.e., active regions. The wafer is then placed in an oxidizing environment. The portions of the wafer surface not covered by the oxidation barrier oxidize to form thermal silicon dioxide. Oxidation is masked from the active regions by the oxidation barrier. LOCOS field oxide is generally formed to a sufficient thickness that a conductor placed thereover will not invert the channel thereunder, when biased to the maximum circuit voltage. LOCOS, however, is subject to certain known limitations, including encroachment of the oxide into the active regions due to oxidation of silicon under the edges of the nitride mask and the adding of topography to the integrated surface.

A more recently known isolation technique uses trenches etched into the surface of the wafer at the isolation locations. The trenches are then filled with a thermal or deposited oxide. Such trench isolation can provide extremely thick isolation oxides which extend into the wafer surface with little or no encroachment. Etching of deep trenches, however, can be a relatively expensive process and can be quite difficult to perform when attempting to maintain close geometries. Also, thermally formed silicon dioxide, for example, generally has a higher integrity than deposited silicon dioxide. The formation of thermal silicon dioxide trenches, however, causes stress in the silicon due to volume expansion of silicon dioxide from that of the silicon prior to oxidation. Accordingly, trench isolation tends to largely rely on deposited oxide.

Even more recently, integrated circuits with planarized shallow trench isolation ("STI") have been developed such as seen in U.S. Pat. Nos. 5,130,268 and 5,410,176 each by Liou et al. and respectively titled *Method For Forming Planarized Shallow Trench Isolation In An Integrated Circuit And A Structure Formed Thereby*" and "*Integrated Circuit With Planarized Shallow Trench Isolation.*" After formation of the recesses, sidewall filaments of insulating material, such as silicon dioxide, are formed into some or all of the recesses thereby exposing the bottom silicon portion thereof. Selective epitaxy then forms a silicon layer within the recesses from the bottom up, but not along the sides or sidewalls. The selective epitaxial layer is oxidized so that the recesses are substantially filled with thermal silicon dioxide. Both recesses with vertical sidewalls, formed by anisotropic etching of the silicon, or sloping sidewalls, formed by more isotropic silicon etching, can be utilized.

One of the key processes for STI is planarization after trench fill. The conventional methods generally require some type of inverse active pattern, resist/oxide etchback, resist strip, and CMP to complete the planarization process. These planarization process requirements, however, may not provide the consistent results desired. For example, the resulting integrated circuits using CMP for the planarization process can result in erosion of the corners extending along peripheral regions of the trench and can result in dishing along the upper surface of the filled trench.

SUMMARY OF THE INVENTION

In view of the foregoing background, the present invention advantageously provides a method of forming an integrated circuit having a substantially planar upper surface substantially devoid of corner erosion and devoid of dishing. The present invention also advantageously provides a method of forming an integrated circuit having a spacer after shallow trench fill and an integrated circuit formed thereby which effectively eliminates conventional planarization process steps such as inverse active pattern and resist strip. The present invention additionally advantageously provides a method of forming an integrated circuit that reduces a likelihood of the present of defects.

More particularly, the present invention provides a method of forming an isolation region in an integrated circuit which preferably includes the step of simultaneously polishing portions of an insulation layer on peripheral regions of at least one trench of a semiconductor substrate and a sacrificial layer of material overlying the at least one trench and having a different polishing rate than the insulation layer so that the sacrificial layer and portions of the insulation layer are removed, so that other portions of the insulation layer remain overlying the at least one trench of the substrate, and so that the upper surface of the at least one trench and the peripheral regions thereof in combination provide a substantially planar surface. The polishing, for example, is preferably chemical-mechanical polishing ("CMP"). The sacrificial layer, e.g., a nitride layer, preferably has a slower polishing rate than the insulation layer, e.g., an oxide layer.

Another method of forming an isolation region in an integrated circuit according to the present invention preferably includes forming an insulating layer of material in at least one trench of a substrate and on peripheral regions of the at least one trench of the substrate and forming a sacrificial layer of material on the insulation layer having a different removal rate than the insulation layer. The method also preferably includes removing the layer having the different removal rate and portions of the insulation layer remain overlying the at least one trench of the substrate and so that the upper surface of the at least one trench and the peripheral regions thereof in combination provide a substantially planar surface.

An additional method of forming an isolation region in an integrated circuit according to the present invention preferably includes forming at least one trench in a semiconductor substrate, forming an insulation layer of material in the at least one trench and on peripheral regions of the at least one trench of the semiconductor substrate, and forming a sacrificial layer of material on the insulation layer having a different polishing rate than the insulation layer. The method preferably also includes polishing the layer having the different polishing rate and portions of the insulation layer so that the layer having the different polishing rate and portions of the insulation layer are removed, so that other portions of the insulation layer remain overlaying the at least one trench of the substrate, and so that the upper surface of the at least one trench and the peripheral regions thereof in combination provide a substantially planar surface.

Yet another method of forming an isolation region in an integrated circuit preferably includes forming at least one trench in a surface of a semiconductor substrate so that the surface has at least two high regions and at least one low region thereof, forming a layer of oxide over the at least two high regions and the at least one low region of the substrate, forming a sacrificial layer of nitride on the oxide layer, and partially removing overlying portions of the nitride layer. The method preferably also includes removing the remaining portions of the nitride layer and portions of the oxide layer so that other portions of the oxide layer remain overlying the at least one low region of the substrate and so that the upper surface of the at least two high regions and the at least one filled trench in combination provide a substantially planar surface.

The present invention also provides an integrated circuit which includes a semiconductor substrata and at least one trench formed in the semiconductor substrate and which has a polished insulation layer substantially filled therein. The integrated circuit also preferably includes peripheral regions of the semiconductor substrata extending along the at least one trench of the semiconductor substrate so that the upper surface of the substantially filled at least one trench and the peripheral regions thereof in combination provide a substantially planar surface and so that the polished insulation layer substantially filling the at least one trench of the substrate is substantially devoid of dishing and so that corners of the peripheral regions of the at least one trench have relatively sharp edges and are substantially devoid of corner erosion.

A device for forming an isolation region of an integrated circuit is also provided according to the present invention. The device preferably includes a semiconductor substrate, at least one trench formed in the semiconductor substrate, and a conformal insulation layer on the at least one trench and peripheral regions of the at least one trench of the semiconductor substrate. The device preferably further includes a sacrificial layer of material on the conformal layer and overlaying only the at least one trench. The sacrificial layer preferably has a different polishing rate than the conformal insulation layer and has a relatively thin layer thereof overlying medial portions of the at least one trench and a relatively thicker spacer over sidewall regions of the at least one trench.

BRIEF DESCRIPTION OF THE DRAWINGS

Some of the features, advantages, an benefits of the present invention having been stated, others will become apparent as the description proceeds when taken in conjunction with the accompanying drawings in which:

FIG. 1 is an enlarged sectional view of a process step of forming an isolation region of an integrated circuit according to the present invention;

FIG. 2 is an enlarged sectional view of another process step of forming an isolation region of an integrated circuit according to the present invention;

FIG. 3 is an enlarged sectional view of an additional process step of forming an isolation region of an integrated circuit according to the present invention.

FIG. 4 is an enlarged sectional view of a fourth process step of forming an isolation region of an integrated circuit according to the present invention.

DETAILED DESCRIPTION OF A PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

FIGS. 1–4 illustrate an integrated circuit structure or device 10 according to various process or methods steps of forming an isolation region 20 of an integrated circuit 10 of the present invention. FIG. 1 for example, illustrates a semiconductor substrate 22 or wafer having relatively shallow trenches 15, cavities, or recesses formed therein, e.g., STI. As such, these trenches 15 are relatively easy to etch without requiring high levels of anisotrophy, high etch rates, or expensive etch equipment. As understood by those skilled in the art, the substrate 22, for example, can be patterned, etched, and/or stripped prior to or along with forming of the trenches 15. Thin sidewalls can then be oxidized.

As understood by those skilled in the art, the present invention is applicable to single well, twin well, and triple well CMOS processes, and to other technologies including bipolar, n-channel and p-channel MOS, and BiCMOS technologies as well. Also, the conductivity type and concentrations may vary as well for these technologies. These technologies may have active devices formed directly into a monolithic substrate or into an epitaxial layer at the surface of the substrate. Accordingly, as understood by those skilled in the art, the present invention can be particularly beneficial to all CMOS types of devices or integrated circuits and, even more particularly, to sub-half micron CMOS type applications.

A method of forming an isolation region 20 in an integrated circuit 10 preferably includes forming at least one trench 15 in a surface of a semiconductor substrate 22 so that the surface has at least two high peripheral regions 16, 17 and at least one low region 18 thereof as illustrated in FIG. 1. An insulation layer 24, e.g., an oxide layer such as silicon dioxide, is formed, e.g., deposited, on the least at least two high regions 16, 17 and on the at least one low region 18 of the substrate 22. The at least two high regions 16, 17 of the semiconductor substrate 22, for example, can include an oxide layer or pad 26 on a layer of silicon and a nitride layer or pad 27 on the oxide layer 26 positioned on the silicon layer. The forming of an insulation layer 24 of oxide on the semiconductor substrate 22 preferably includes forming the insulating oxide layer 24 over the nitride layer 27 of the at least two high regions 16, 17 of the substrate 22.

A sacrificial layer 28 having a different removal or polishing rate is formed on the insulation layer 24. The different polishing rate of the sacrificial layer 28 is preferably a slower polishing rate. The sacrificial layer 28, for example, can include at least one of a nitride, titanium nitride, polysilicon, or an oxide having a different doping than the oxide of the insulation layer 24. The insulation layer 24, for example, can be a doped oxide and the sacrificial layer 28 can be undoped oxide. The insulation layer 24, however, preferably includes an oxide and the sacrificial layer 28 preferably includes a nitride. The nitride layer 28 preferably has a thickness in the range of 100–5000 Angstroms. In essence, the material or film can be any material having a different polishing rate and is preferably selectively chosen based upon the polishing or removal technique and the desired results.

As perhaps best illustrated in FIG. 2, overlying or upper portions of the nitride layer 28 are partially removed. This partial removal of the nitride layer 28, for example, can be performed by partially etching back the nitride layer 28 such as by using a plasma etch. As illustrated, this process leaves one high region 16, 17 and a relatively thicker nitride spacer 29 on or over sidewall regions 19 of the at least one trench 15. Additionally, a relatively thin layer of nitride remains overlying medial portions of the conforming trench fill material.

As illustrated in FIG. 3, the method can also include a partial polishing, e.g., CMP, of the nitride layer 28 so as to entirely remove portions of the nitride layer 28 only in the at least two high peripheral regions 16, 17 of the substrate 22. Notably, relatively thick nitride spacers 29 remain along the sidewalls 19 of the conforming trench and a relatively thin nitride layer 31 remains on and overlies the medial portions of the conforming trench fill material.

FIG. 4 illustrates the removal of the remaining portions of the nitride layer 28 and portions of the oxide layer 24 such as by simultaneously polishing the remaining portions of the nitride layer 28 and potions of the oxide layer 24 so that the other portions of the oxide layer 24 positioned in the at least one low region of the substrate 22 are substantially devoid of dishing and so that corners of the at least two high regions of the substrate thereby form relatively sharp edges and are substantially devoid of corner erosion. In other words, the upper surface of the at least two high peripheral regions 16, 17 and the at least one filled trench in combination provide a substantially planar or flat surface.

As perhaps best illustrated in FIG. 4, the present invention also provides an integrated circuit 10 which includes a semiconductor substrate 22 and at least one trench 15 formed in the semiconductor substrate 22 and which has a polished insulation layer 24 substantially filled therein. The integrated circuit 10 also preferably includes peripheral regions 16, 17 of the semiconductor substrate 22 extending along the at least one trench 15 of the semiconductor substrate 22 so that the upper surface of the substantially filled trench and the peripheral regions 16, 17 thereof in combination provide a substantially planar surface. Also, the polished insulation layer 24 which substantially fills the at least one trench 15 of the substrate 22 is also substantially devoid of dishing. Further, corners of the peripheral regions 16, 17 of the at least one trench 15 now advantageously have relatively sharp edges and are substantially devoid of corner erosion.

As perhaps best illustrated in FIG. 3, the present invention also includes a device or integrated circuit structure 10 forming an isolation region 20 thereof. The device 10 preferably includes a semiconductor substrate 22, at least one trench 15 formed in the semiconductor substrate 22, and a conformal insulation layer 24 on the at least one trench 15 and peripheral regions 16, 17 of the at least one trench 15 of the semiconductor substrate 22. The device 10 preferably further includes a sacrificial layer 28 of material on the conformal layer 24 and overlying only the at least one trench 15. The sacrificial layer 28 preferably has a different polishing rate than the conformal insulation layer 24 and has a relatively thin layer thereof overlying medial portions of the at least one trench 15 and a relatively thicker spacer on or over sidewall regions 19 of the at least one trench 15.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed:

1. A method of forming an isolation region in an integrated circuit comprising the steps of:

forming at least one trench in a surface of a semiconductor substrate so that the surface has at least two high regions and at least one low region thereof;

forming a layer of oxide on the at least two high regions and on the at least one low region of the substrate;

forming a sacrificial layer of nitride on the oxide layer;

partially removing outer surface portions of the nitride layer by partially etching back the nitride layer so as to leave a relatively thin layer of nitride overlying the at least one high region and a relatively thicker nitride spacer overlying sidewall regions of the at least one trench; and removing the remaining portions of the nitride layer and portions of the oxide layer so that other portions of the oxide layer remain overlying the at least one low region of the substrate and so that an outer surface of the at least two high regions and the at least one filled trench in combination provide a substantially planar surface.

2. A method as defined in claim 1, wherein the step of removing the remaining portions of the nitride layer and portions of the oxide layer includes a partial polishing of the nitride layer so as to entirely remove portions of the nitride layer only overlying the at least two regions of the substrate.

3. A method as defined in claim 1, wherein the step of removing the remaining portions of the nitride layer and portions of the oxide layer includes simultaneously polishing the remaining portions of the nitride layer and portions of the oxide layer so that the other portions of the oxide layer positioned overlying the at least one low region of the substrate are substantially devoid of dishing and so that corners of the at least two high regions of the substrate thereby form relatively sharp edges and are substantially devoid of corner erosion.

4. A method as defined in claim 1, wherein the step of removing the remaining portions of the nitride layer and portions of the oxide layer includes chemical-mechanical polishing of the remaining portions of the nitride layer and portions of the oxide layer.

5. A method as defined in claim 1, wherein the at least two high regions of the semiconductor substrate include an oxide layer on a layer of silicon and a nitride layer on the oxide layer positioned on the silicon layer, and wherein the step of forming a layer of oxide on the semiconductor substrate includes forming the oxide layer on the nitride layer of the at least two high regions of the substrate.

6. A method as defined in claim 1, wherein the step of partially etching back includes a plasma etch.

7. A method as defined in claim 1, wherein the nitride layer has a thickness in the range of 100–5000 Angstroms.

8. A method as defined in claim 1, wherein the step of forming the at least one trench includes etching the at least one trench in the semiconductor substrate.

9. A method of forming an isolation region in an integrated circuit comprising the steps of:

forming at least one trench in a semiconductor substrate;

forming an insulation layer of material in the at least one trench and on peripheral regions of the at least one trench of the semiconductor substrate;

forming a sacrificial layer of material on the insulation layer having a different polishing rate than the insulation layer;

partially removing the sacrificial layer having the different polishing rate by partially etching back the sacrificial layer having the different polishing rate so as to leave a relatively thin layer thereof overlying peripheral regions of the at least one trench and a relatively thicker spacer overlying sidewall regions of the at least one trench;

polishing remaining portions of the layer having the different polishing rate and portions of the insulation layer so that the layer having the different polishing rate and portions of the insulation layer are removed, so that other portions of the insulation layer remain in the at least one trench of the substrate, and so that an outer surface of the at least one filled trench and the peripheral regions thereof in combination provide a substantially planar surface.

10. A method as defined in claim 9, wherein the sacrificial layer having the different polishing rate has a slower polishing rate than the insulation layer.

11. A method as defined in claim 10, wherein the insulation layer comprises a first oxide, and wherein the sacrificial layer having the slower polishing rate includes at least one of a nitride, a second differently doped oxide, polysilicon, and titanium nitride.

12. A method as defined in claim 9, wherein the step of partially etching back includes a plasma etch.

13. A method as defined in claim 9, wherein the step of polishing the sacrificial layer having the different polishing rate and portions of the oxide layer includes a partial polishing of the sacrificial layer having the different polishing rate so as to entirely remove portions of the sacrificial layer only overlying the peripheral regions of the at least one trench.

14. A method as defined in claim 13, wherein the step of polishing the sacrificial layer having the different polishing rate and portions of the insulation layer further includes simultaneously polishing the remaining portions of the sacrificial layer and portions of the insulation layer so that the other portions of the insulation layer positioned so as to overlie the at least one trench of the substrate are substantially devoid of dishing and so that corners of the peripheral regions of the at least one trench thereby form relatively sharp edges and are substantially devoid of corner erosion.

15. A method as defined in claim 9, wherein the polishing step includes chemical-mechanical polishing of the sacrificial layer having the different polishing rate and portions of the insulation layer.

16. A method as defined in claim 9, wherein the peripheral regions of the at least one trench includes at least two high regions of the semiconductor substrate, and wherein each of the at least two high regions includes an oxide layer on a layer of silicon and a nitride layer on the oxide layer positioned on the silicon layer, and wherein the step of forming an insulation layer on the semiconductor substrate includes forming a conformal oxide layer on the nitride layer of the at least two high regions of the substrate.

17. A method as defined in claim 9, wherein the layer having a different polishing rate has a thickness in the range of 100–5000 Angstroms.

18. A method as defined in claim 9, wherein the step of forming the at least one trench includes etching the at least one trench in the semiconductor substrate.

19. A method of forming an isolation region in an integrated circuit comprising the steps of:

forming an insulation layer of material in at least one trench of a substrate and on peripheral regions of the at least one trench of the substrate;

forming a sacrificial layer of material on the insulation layer having a slower removal rate than the insulation layer;

partially removing the sacrificial layer having the slower removal rate so as to leave a relatively thin layer thereof overlying peripheral regions of the at least one trench and a relatively thicker spacer overlying sidewall regions of the at least one trench; and removing remaining portions of the layer having the slower removal rate and portions of the insulation layer so that other portions of the insulation layer remain in the at least one trench of the substrate and so that an outer surface of the at least one filled trench and the peripheral regions thereof in combination provide a substantially planar surface.

20. A method as defined in claim 19, wherein the insulation layer comprises a first oxide, and wherein the sacrificial layer having the slower removal rate includes at least one of a nitride, a second differential doped oxide, polysilicon, and titanium nitride.

21. A method as defined in claim 19, wherein the step of partially etching back includes a plasma etch.

22. A method as defined in claim 21, wherein the step of removing the sacrificial layer having the different removal rate and portions of the oxide layer includes a partial removing of the sacrificial layer so as to entirely remove portions of the sacrificial layer only overlaying the peripheral high regions of the at least one trench.

23. A method as defined in claim 22, wherein the step of removing the sacrificial layer having the different removal rate and portions of the insulation layer further includes simultaneously removing the remaining portions of the sacrificial layer and portions of the insulation layer so that the other portions of the insulation layer positioned overlying the at least one trench of the substrate are substantially devoid of dishing and so that corners of the peripheral regions of the at least one trench thereby form relatively sharp edges and are substantially devoid of corner erosion.

24. A method as defined in claim 23, wherein the removing step includes chemical-mechanical polishing of the sacrificial layer having the different removal rate and portions of the insulation layer.

25. A method as defined in claim 24, wherein the peripheral regions of the at least one trench includes at least two high regions of the semiconductor substrate, and wherein each of the at least two high regions includes an oxide layer on a layer of silicon and a nitride layer on the oxide layer positioned on the silicon layer, and wherein the step of forming an insulation layer on the semiconductor substrate includes forming a conformal oxide layer on the nitride layer of the at least two high regions of the substrate and on the at least one trench.

26. A method as defined in claim 25, wherein the layer having a different removal rate has a thickness in the range of 100–5000 Angstroms.

27. A method of forming an isolation region in an integrated circuit comprising the steps of: providing a sacrificial layer of material overlying an insulation layer on peripheral regions of at least one trench of a semiconductor substrate; partially removing the sacrificial layer by partially etching back the sacrificial layer so as to leave a relatively thin layer of sacrificial layer overlying at least one peripheral region and a relatively thicker sacrificial spacer overlying sidewall regions of at least one trench; and simultaneously polishing portions of an insulation layer on peripheral regions of the at least one trench of the semiconductor substrate and the sacrificial layer of material overlying the at least one trench and having a different polishing rate than the insulation layer so that the sacrificial layer and portions of the insulation layer are removed, so that other portions of the insulation layer remain overlying the at least on trench of the substrate, and so that an outer surface of the at least one filled trench and the peripheral regions thereof in combination provide a substantially planar surface.

28. A method as defined in claim 27, wherein the sacrificial layer having the different polishing rate has a slower polishing rate than the insulation layer.

29. A method as defined in claim 27, wherein the insulation layer includes a first oxide, and wherein the sacrificial layer having the slower polishing rate includes at least one of a nitride, a second differently doped oxide, polysilicon, and titanium nitride.

30. A method as defined in claim 29, wherein the step of simultaneously polishing insulation layer and the sacrificial layer having the different polishing rate includes simultaneously polishing remaining portions of the sacrificial layer and portions of the insulation layer so that the other portions of the insulation layer positioned overlying the at least one trench of the substrate are substantially devoid of dishing and so that corners of the peripheral regions of the at least one trench are substantially devoid of corner erosion.

31. A method as defined in claim 27, wherein the simultaneously polishing step includes chemical-mechanical polishing of the sacrificial layer having the different polishing rate and portions of the insulation layer.

32. A method as defined in claim 27, wherein the peripheral regions of the at least one trench includes at least two high regions of the semiconductor substrate, and wherein each of the at least two high regions includes an oxide layer on a layer of silicon and a nitride layer on the oxide layer positioned on the silicon layer, and the method further includes the step of forming a conformal oxide layer in the at least one trench and on the nitride layer of the at least two high regions of the semiconductor substrate prior to the simultaneously polishing step.

33. A method as defined in claim 27, wherein the sacrificial layer has a thickness in the range of 100–5000 Angstroms.

* * * * *